United States Patent [19]

Yamanaka et al.

[11] 4,339,689

[45] Jul. 13, 1982

[54] LIGHT EMITTING DIODE AND METHOD OF MAKING THE SAME

[75] Inventors: Haruyoshi Yamanaka, Takarazuka; Masaru Kazumura, Takatsuki, both of Japan

[73] Assignee: Matsushita Electric Industrial Co., Ltd., Kadoma, Japan

[21] Appl. No.: 115,249

[22] Filed: Jan. 21, 1980

[30] Foreign Application Priority Data

Jan. 29, 1979 [JP]   Japan .................................. 54-9519

[51]  Int. Cl.³ .......................................... H01L 33/00
[52]  U.S. Cl. .................................. 313/499; 148/175; 357/17
[58]  Field of Search .................. 313/498, 499; 357/17; 29/569 C; 148/175; 313/110

[56] References Cited

U.S. PATENT DOCUMENTS 3,981,023  9/1976  King et al. ............................ 357/17

*Primary Examiner*—Eugene R. LaRoche
*Attorney, Agent, or Firm*—Cushman, Darby & Cushman

[57] ABSTRACT

A light-emitting diode is comprised of:
a semiconductor active layer,
a semiconductor first clad layer formed on a surface of said semiconductor active layer, and
a protrusion formed unitarily on a surface of said first clad layer for facing an input end of a light guide for light coupling therewith.

A method of manufacturing the light emitting diode is comprised of the steps of
forming a recess on one face of a semiconductor substrate,
forming a semiconductor first clad layer on the above-mentioned face of the semiconductor substrate, and
selectively etching the substrate from the other face thereof so as to form a through-hole reaching said recess on said one face of the semiconductor substrate, thereby exposing at least a protrusion of said semiconductor first clad layer formed in said recess.

14 Claims, 6 Drawing Figures

LIGHT EMITTING DIODE AND METHOD OF MAKING THE SAME

BACKGROUND OF THE INVENTION

1. Field of the Invention

The present invention relates to an improvement in light emitting diodes and a method of making the same.

More particularly, the present invention concerns an improvement in light emitting diodes especially suitable for optical communications and a method of making the same.

2. Description of the Prior Art

Light emitting diodes have, in addition to their reliability, a superior characteristic in good linearity in input current vs. output light suitable for analogue transmission in optical communications. Light emitting diodes utilizing GaAs-GaAlAs crystal for 0.8 μm band with a considerable efficiency and reliability have been already developed and are now in practical use in short distance and intermediate distance optical communications.

However, the most important problem in the practical optical communication system is optical coupling between the light emitting diode and the optical fiber, and in the conventional technique, the coupling part produces the largest loss in the optical circuitry.

FIG. 1 is a sectional side view showing one example of the conventional light emitting diode for optical communication, which comprises:

| | |
|---|---|
| a substrate 1 of | n-GaAs |
| a first epitaxial layer 2 of | 10μm thick n-Ga$_{1-x}$Al$_x$As, (0 < x ≦ 1), |
| a second epitaxial layer 3 of | 1.5μm thick p-GaAs (active layer), |
| a third epitaxial layer 4 of | 1.0μm thick p-Ga$_{1-x'}$Al$_{x'}$As, (0 < x' ≦ 1), |
| a fourth epitaxial layer 5 of | 1.0μm thick p-GaAs, |
| an insulating film 6 of | SiO$_2$, |
| a p-side electrode 7 of | vacuum-deposited Au and |
| an n-side electrode 8 of | Au-Ge-Ni alloy. |

The substrate has an opening 9 to expose a surface 21 of the first epitaxial layer 2 and an input end of an optical fiber 17 is disposed therein facing the surface 21.

Though having very high internal quantum efficiency, due to a high refractive index of the crystal forming the first epitaxial layer 2, almost all parts of the emitted light is are reflected towards the inside by the surface of the crystal, thereby lowering the external efficiency to only several %. Furthermore, since no structure is provided in the conventional light emitting diode to lead out the light like that in laser, the light of the conventional light emitting diode generally makes a wide distribution called "Lambertian". On the other hand, in an optical fiber the incident angle of light to be effectively transmitted is limited by the numerical aperture (NA) thereof, and therefore, due to the narrow incident angle the coupling efficiency from the light-emitting diode to the optical fiber is very small. Accordingly, in order to increase the overall input power to the optical fiber, in addition to the abovementioned increase of the external quantum efficiency, control of the distribution of the output light by a suitable measure is needed thereby to effectively lead the light into the optical fiber. Hitherto, for increasing coupling efficiency, such measures have been taken as to form the input ends of the optical fiber into a hemisphere or to insert a spherical lens between the light emitting diode and the input ends of the optical fiber. However, the former measure of spherical ended fiber coupling has a problem of difficulty in obtaining, in mass production, uniform hemisphere curvatures to which the coupling efficiency depends on, and the latter measure of inserting the minute spherical lens has a problem of difficulty in aligning its optical axis and fixing it in a right position.

SUMMARY OF THE INVENTION

The present invention provides an improved light emitting diode wherein the coupling efficiency with optical fiber and mass-production of the device are very much improved by employing a novel structure.

More particularly, the present invention can provide a light emitting diode which dispenses with the conventional spherical ended fiber or the conventional additional spherical lense disposed between the light emitting diode and the optical fiber.

Also, a method in accordance with the present invention provides a method of making the light emitting diode of novel structure with mass-production techniques.

DESCRIPTION OF THE PREFERRED EMBODIMENT

A light emitting diode in accordance with the present invention comprises:

a semiconductor active layer, a semiconductor first clad layer formed on a surface of said semiconductor active layer, and a protrusion formed unitarily on a surface of said first clad layer to face an input end of a light guide for light coupling therewith.

A method of manufacturing a light emitting diode in accordance with the present invention comprises the steps of:

forming a recess on one face of a semiconductor substrate, forming a semiconductor first clad layer on the abovementioned face of the semiconductor substrate, and selectively etching the substrate from the other face thereof so as to form a through-hole reaching said recess on said one face of the semiconductor substrate, thereby to expose at least a protrusion of said semiconductor first clad layer formed in said recess.

Figures 1, 2:
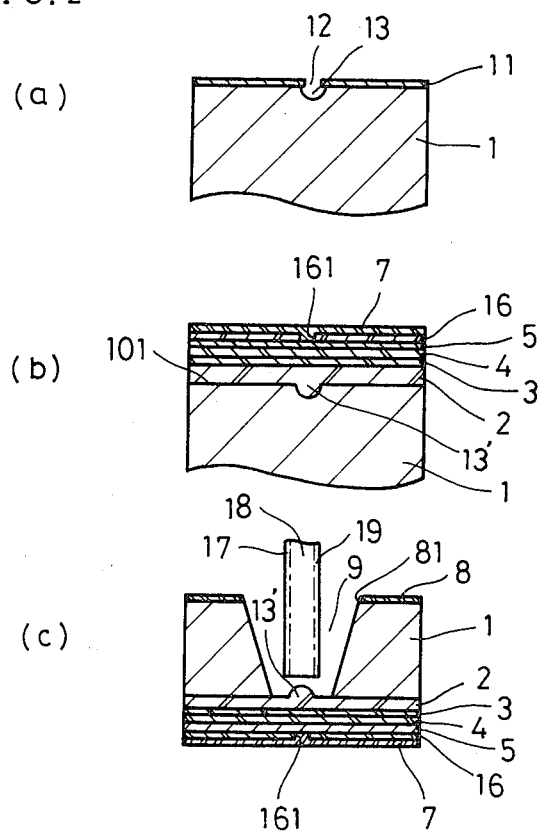
FIG. 1 is a sectional side view showing one example of the conventional light emitting diode for optical communication.
FIGS. 2, (a), (b) and (c) are sectional side views showing steps of manufacturing a light emitting diode embodying the present invention.
Figure 3:
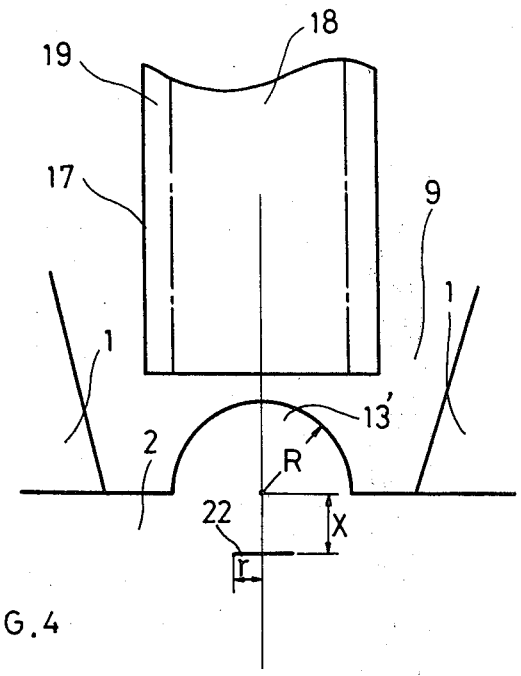
FIG. 3 is an enlarged sectional side view showing an essential part of the light emitting device in accordance with the present invention for explaining the sizes of various parts of the device.
Figure 4:
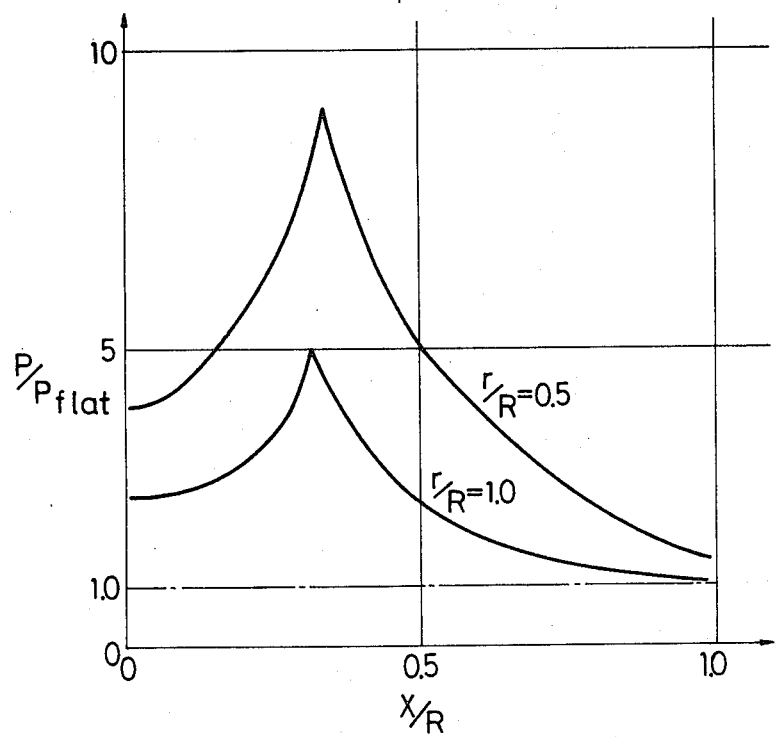
FIG. 4 is a graph showing the relation between device geometry and coupling efficiencies of the light emitting device embodying the present invention.

A preferred embodiment of the present invention is elucidated hereafter referring to FIGS. 2 to 4.

FIGS. 2, (a), (b) and (c) are sectional side views showing steps of a manufacturing process of a light emitting diode embodying the present invention.

At first, an oxide film 11 is formed on one face of a semiconductor substrate 1 of GaAs having n-type conductivity and an opening 12 of about 10 μm radius is formed on the oxide film 11. Then by immersing in an etchant prepared by blending two parts sulfuric acid (of 95% aqueous solution) and one part of hydrogen peroxide (of 34% aqueous solution) and kept at 100°±5° C., the substrate is etched to form a recess 13 of hemispherical shape as shown by FIG. 2(a). The depth and diameter of the recess 13 are controlled by varying the etching time and the diameter of the opening 12, respectively. Then, the oxide film 11 is removed by a known method and subsequently thereafter, on the exposed surface of the substrate 1 including on the surface in the recess 13, sequential epitaxial growths are made to form the following epitaxial layers on the substrate 1 of n-GaAs:

| a first epitaxial layer (first clad layer) 2 of | 7.5μm thick n-Ga$_{1-x}$Al$_x$As, (0 < x ≦ 1), |
|---|---|
| a second epitaxial layer (active layer) 3 of | 1.5μm thick p-Ga$_{1-y}$Al$_y$As, (0 ≦ y < x, x'), |
| a third epitaxial layer (second clad layer) 4 of | 1.0μm thick p-Ga$_{1-x'}$Al$_{x'}$As, (0 < x' ≦ 1), |
| a fourth epitaxial layer (electrode contacting layer) 5 of | 1.0μm thick p-GaAs, and |
| a fifth epitaxial layer (current limiting layer) 16 of | 2.0μm thick n-Ga$_{1-z}$Al$_z$As (0 < z ≦ 1). |

Then, by utilizing a known photoresist etching method, the fifth epitaxial layer 16 is etched by an iodine-containing etchant to form an opening 161 of 25 μm diameter. Subsequently, a p-side electrode 7 of an Au film is formed by vapor-deposition on the whole area on the fifth epitaxial layer 16 and in the opening 161, as shown by FIG. 2(b).

Then, after etching the substrate 1 from the rear face thereby thinning it to a predetermined thickness, an n-side electrode of Au-Ge-Ni alloy is formed to have a large opening 81 by utilizing a known photolithographic method. Then, by utilizing another photolithographic method, a coupling hole 9 is formed through the opening 81 in the substrate 1 thereby exposing the surface of the first epitaxial layer 2 having a hemispherical protrusion 13' thereon, which has been formed by the epitaxial growth in the hemispherical recess 13 of the substrate 1.

The input end of the optical fiber 17 is then disposed in front of the protrusion 13' in the coupling hole 9. As shown in FIG. 3, the diameter of the protrusion is selected small than that of the core 18 of the optical fiber 17, the core 18 being encircled by a clad layer 19.

One example in accordance with the present invention is made in the following size and characteristics:

| diameter of the core 18 of the optical fiber 17 | 100 μm |
|---|---|
| numerical aperture of the optical fiber 17 | 0.28. |

As a result of the abovementioned structure of providing the hemispherical protrusion 13', output of the optical fiber 17 becomes about 9 times as large as that of the conventional case shown in FIG. 1.

The protrusion may be formed in the shape of a paraboloid of revolution, cone, pyramid, cylinder, or any other light converging shape.

The present invention can be applicable, not only to the GaAs-GaAlAs devices, but also to the InP-InGaAsP, InP-InAsP or GaP-GaAsP devices.

As shown in the abovementioned examples, the light emitting device in accordance with the present invention comprises light-converging protrusion 13' on the first clad layer 2, which effectively converges light and emits it from the top face thereof. The curvature of the protrusion 13' can be precisely adjusted by the etching time of the substrate 1. The protrusion 13' is disposed precisely in front of the light emitting region 22, and therefore, there is no fear of mislocating of a light converging lens between the light emitting diode and the optical fiber 17, as in the conventional device.

The inventors made experimental and theoretical studies on the light coupling efficiency of the device in accordance with the present invention. In the device, the light emitting region 22 of radius r lies at the depth of X from the center of the hemispherical lens 13' which has a radius R. The radius r is dependent on the radius of the opening 161 in which the p-side electrode 7 contacts the fourth epitaxial layer 5 and the depth X is defined mainly by the thickness of the first clad layer 2. Then, the ratio $P/P_{flat}$ of optical power P of the device coupled to an optical fiber 17 of numerical aperture of 0.28 with respect to the optical power $P_{flat}$ of the conventional device of the structure of FIG. 1 for a flat ended optical fiber is shown in the graph of FIG. 4 as a function of X/R for different values of the ratio of r/R. As shown from the graph, for the X/R ratio of 0.3 to 0.4, the coupling efficiency of the device in accordance with the present invention is 5 to 10 times as high as that of the conventional device with a flat ended optical fiber. In actual use, the usable range of X/R is between 0 and 1, and the radius of the lens constituted by the protrusion should be smaller than that of the core of the optical fiber for good coupling efficiency. The radius of the lens 13', the radius of the light emitting region 22 and the depth X of the light emitting region 22 from the center of the hemisphere of the lens 13 are precisely controlled by adjusting the conditions of epitaxial crystal growth, photolithographic etching and the radius of the opening 161 of the current limiting layer 16.

As has been elucidated in detail referring to the above described embodiment, according to the present invention, the coupling efficiency is greatly improved with a high reproducibility by forming a hemispherical protrusion 13' on the surface of the first clad layer 2, thereby dispensing with the necessity of disposing a minute lens or using spherical ended optical fiber fibers.

What is claimed is:

1. A light emitting diode having an improved surface for coupling with a light guide, comprising:
   a semiconductor active layer,
   a semiconductor first clad layer formed on a surface of said semiconductor active layer;
   a protrusion formed unitarily on a surface of said first clad layer for facing an input end of said light guide to effect light coupling therewith, and wherein
   a depth X measured from the surface of said clad layer to a light emitting region of said clad layer and a radius R of said protrusion have a relationship of $0 < X/R \leq 0.6$.

2. A light emitting diode in accordance with claim 1, wherein said light guide is an optical fiber.

3. A light emitting diode in accordance with claim 1, or 2 wherein said protrusion forms a light converging lens.

4. A light emitting diode in accordance with claim 1, or 2 wherein said protrusion is of a hemispherical shape.

5. A light emitting diode in accordance with claim 1, or 2 wherein said semiconductor first clad layer is a $Ga_{1-x}Al_xAs$ layer ($0 < x \leq 1$) of n-type conductivity and said active layer is a $Ga_{1-y}Al_yAs$ layer ($0 \leq y < x$) of p-type conductivity.

6. A light emitting diode in accordance with claim 5, which further comprises a third layer of $Ga_{1-x'}Al_{x'}As$ ($y < x' \leq 1$) of p-type conductivity on the rear surface of said active layer and a fourth layer of GaAs of p-type conductivity on the rear surface of said third layer.

7. A light emitting diode in accordance with claim 1, or 2 wherein a substrate having a through-hole is provided on the surface of said first clad layer in such a manner that said protrusion is exposed in said through-hole.

8. A light emitting diode in accordance with claim 1 or 2, wherein the radius of said protrusion is smaller than that of the end face of the light guide.

9. A light emitting diode in accordance with claim 1 or 2, wherein the radius of said protrusion is smaller than that of the core of the light guide.

10. A light emitting diode formed by the method comprising the steps of:
   forming a recess of a semi-spherical shape on one face of a semiconductor substrate,
   forming a semiconductor first clad layer on the above-mentioned face of the semiconductor substrate,
   forming a semiconductor active layer on said semiconductor first clad layer, and
   selectively etching the substrate from the other face thereof so as to form a through-hole reaching said recess on said one face of the semiconductor substrate, thereby to expose at least a protrusion of said semiconductor first clad layer formed in said recess,
   wherein the forming of said recess is made in such a manner that a depth X measured from the center of a hemisphere of said protrusion to a light emitting region and a radius R of the hemisphere of said protrustion have a relationship of $0 < X/R \leq 0.6$.

11. A light emitting diode formed in accordance with claim 10, wherein said first clad layer is an epitaxial growth layer of $Ga_{1-x}Al_xAs$ ($0 < x \leq 1$) of n-type conductivity, on which a semiconductor active layer of $Ga_{1-y}Al_yAs$ ($0 \leq y < x$) is subsequently formed by sequential epitaxial growth method.

12. A light emitting diode formed in accordance with claim 11, wherein a $Ga_{1-x'}Al_{x'}As$ layer ($y < x' \leq 1$) of p-type conductivity and a GaAs layer of p-type conductivity are subsequently formed by sequential epitaxial growth method on said active layer.

13. A light emitting diode having an improved surface for coupling with a light guide, comprising:
   a semiconductor active layer,
   a semiconductor first clad layer formed on a surface of said semiconductor active layer,
   a hemispherical protrusion formed unitarily on a surface of said first clad layer for facing an input end of said light guide to effect light coupling therewith, wherein a depth X measured from the center of the hemisphere of said protrusion to a light emitting region and a radius R of the hemisphere of said protrustion have a relationship of $0 < X/R \leq 0.6$.

14. A light emitting diode in accordance with claim 13, wherein a substrate having a conic through-hole is provided on the surface of said first clad layer in such a manner that said protrusion is exposed in said conic through-hole.

* * * * *